(12) United States Patent
Bakos

(10) Patent No.: US 8,998,660 B2
(45) Date of Patent: Apr. 7, 2015

(54) CLAMPING ELEMENT

(71) Applicant: Continental Automotive GmbH, Hannover (DE)

(72) Inventor: Tibor Bakos, Timisoara (RO)

(73) Assignee: Continental Automotive GmbH, Hannover (DE)

( * ) Notice: Subject to any disclaimer, the term of this patent is extended or adjusted under 35 U.S.C. 154(b) by 236 days.

(21) Appl. No.: 13/676,734

(22) Filed: Nov. 14, 2012

(65) Prior Publication Data

US 2013/0122760 A1 May 16, 2013

(30) Foreign Application Priority Data

Nov. 14, 2011 (EP) .................................... 11464021

(51) Int. Cl.
| | |
|---|---|
| H01R 4/00 | (2006.01) |
| H01R 4/28 | (2006.01) |
| B60R 16/023 | (2006.01) |
| H05K 3/32 | (2006.01) |
| H01R 12/58 | (2011.01) |
| H01R 4/26 | (2006.01) |
| H05K 3/40 | (2006.01) |

(52) U.S. Cl.
CPC .............. *H01R 4/28* (2013.01); *B60R 16/0238* (2013.01); *H05K 3/325* (2013.01); *H01R 12/58* (2013.01); *H01R 4/26* (2013.01); *H05K 3/403* (2013.01); *H05K 2201/10287* (2013.01); *H05K 2201/10962* (2013.01)

(58) Field of Classification Search
USPC ............. 439/878, 435, 816, 867, 63, 585, 92, 439/496, 761, 877; 174/74 R, 75 C, 84 C, 174/21 C, 84 R, 78, 260, 252, 261; 29/844, 29/845, 861, 863; 361/638, 649

See application file for complete search history.

(56) References Cited

U.S. PATENT DOCUMENTS

| | | | |
|---|---|---|---|
| 3,287,686 A | | 11/1966 | Rühlemann |
| 3,808,588 A | * | 4/1974 | McGregor .................... 439/872 |
| 3,953,103 A | * | 4/1976 | Mathis .......................... 439/866 |
| 4,629,267 A | | 12/1986 | Stepan |
| 4,688,149 A | | 8/1987 | Inoue et al. |
| 5,112,249 A | * | 5/1992 | Henry et al. .................. 439/581 |
| 5,295,862 A | * | 3/1994 | Mosquera ..................... 439/567 |
| 5,402,315 A | * | 3/1995 | Reichle ......................... 361/784 |
| 5,575,691 A | * | 11/1996 | Matthews ..................... 439/744 |
| 5,772,454 A | * | 6/1998 | Long, Jr. .......................... 439/83 |

(Continued)

FOREIGN PATENT DOCUMENTS

| | | |
|---|---|---|
| GB | 1 040 998 A | 9/1966 |
| JP | 2008-153137 A | 7/2008 |

*Primary Examiner* — Abdullah Riyami
*Assistant Examiner* — Harshad Patel
(74) *Attorney, Agent, or Firm* — Cozen O'Connor

(57) ABSTRACT

A clamping element for fastening an electrical conductor to a printed circuit board, by which electrically conductive connection between the electrical conductor and the printed circuit board is produced. In order to achieve an inexpensive and completely automatable possibility for connection between electrical conductors and printed circuit boards, the clamping element is in the form of a stamped sheet-metal part and has at least two clamping wings and one clamping web, which is arranged between the clamping wings. The clamping web is capable of being bent in such a way that the clamping wings clamp in the conductor. At least one securing claw is formed on the clamping wings. The securing claw can be pressed into the printed circuit board.

7 Claims, 4 Drawing Sheets

(56) References Cited

U.S. PATENT DOCUMENTS

| | | | |
|---|---|---|---|
| 6,106,310 A * | 8/2000 | Davis et al. | 439/95 |
| 6,372,990 B1 * | 4/2002 | Saito et al. | 174/74 R |
| 7,335,029 B2 * | 2/2008 | Backeralf et al. | 439/67 |
| 2008/0144301 A1 | 6/2008 | Konishi | |

* cited by examiner

CLAMPING ELEMENT

CROSS-REFERENCE TO RELATED APPLICATION

This application claims priority to European Application No. EP 11 46 4021, filed Nov. 14, 2011, the content of which is incorporated by reference herein.

BACKGROUND OF THE INVENTION

1. Field of the Invention

The invention is directed to a clamping element for fastening an electrical conductor on a printed circuit board. The invention furthermore is directed to a fastening system for an electrical conductor on a printed circuit board, and to a method for fastening an electrical conductor on a printed circuit board.

2. Description of the Related Art

For many years electronic circuits have been used in the automotive sector, with such electronic circuits usually being arranged on printed circuit boards and serving the purpose of controlling a large number of functions in the automobile. With the increased development of electrically driven vehicles, this tendency is increased, with the demand for currents with high current intensities to be fed, controlled and transmitted increasing, in addition to the demand for the reliability of the circuits. Until now, the printed circuit boards have been connected to the electrical conductors by means of soldering methods. These methods are relatively difficult to automate and generally increased contact resistances arise at the soldered joints, which can lead to the joints being heated, especially when electrical currents with a high current intensity are transmitted. The heating of these joints between the printed circuit board and the electrical conductor can result in the joint being destroyed, which in any case needs to be avoided. In accordance with the prior art, electrical lines with a greater cross section and larger soldered joints on the printed circuit board have simply been used in order to avoid such overheating of the joint between the electrical conductor and the printed circuit board. In the case of a large number of joints between electrical conductors and printed circuit boards in modern motor vehicles, this overdimensioning of the conductors and the joints has a not inconsiderable influence both on the weight of the overall vehicle and on the manufacturing costs of the electrical and electronic systems.

SUMMARY OF THE INVENTION

The invention is therefore based on the problem of developing the known method for fastening an electrical conductor on a printed circuit board in such a way that as high a level of automation as possible can be achieved when fastening an electrical conductor on a printed circuit board, with the intention being to find a solution which is as inexpensive as possible.

According to an embodiment of the invention a clamping element is in the form of a stamped sheet-metal part and has at least two clamping wings and one clamping web, which is arranged between the clamping wings. The clamping web is capable of being bent back in such a way that the clamping wings clamp in the conductor. At least one securing claw is formed on the clamping wings; the securing claw is capable of is pressed into the printed circuit board. Such a clamping element can be produced in a very inexpensive and fully automated manner. The clamping element can be used to fasten the conductor on the printed circuit board securely and for a long period of time, with an excellent electrical connection between the conductor and the printed circuit board being achieved. This electrical connection has a particularly low contact resistance between the conductor and the printed circuit board. As a result, a relatively high current can be transmitted to the printed circuit board via the electrical conductor without undesired overheating of this fastening and connection point taking place in the region in which the conductor is fastened on the printed circuit board.

In another embodiment of the invention, the clamping wings have a conductor pocket which surrounds the conductor. The electrical conductor is mounted particularly securely in this conductor pocket, with it being possible for the conductor pocket to be formed with sharp edges at its rims. The conductor pocket is embedded in the surface of the conductor and therefore completely prevents sliding of the conductor.

In another embodiment of the invention, the clamping wings have a clamping wing arch, which makes it possible for the conductor to be mounted in a sprung manner. By virtue of the fact that the conductor is mounted in a sprung manner, the pressure exerted by the clamping wings on the conductor can be predetermined precisely, and this pressure is maintained over the life of the connection between the conductor and the printed circuit board. Therefore, the connection is provided with a very long life and a high loading capacity. Furthermore, the clamping wing arches ensure precise and stable positioning of the clamping element in the receiving element.

In addition, it is advantageous if the clamping wings have a contact face. This contact face can be delimited by the clamping wing arches, for example. The contact face ensures a particularly low-resistance electrical connection between the electrical conductor and the printed circuit board.

The clamping element according to the invention maybe implemented in a fastening system for an electrical conductor on a printed circuit board. The fastening system includes a receiving element with an electrically conductive surface formed on the printed circuit board. The clamping element is inserted into the receiving element.

In this case, it is advantageous if the receiving element is in the form of a U since the clamping element can be inserted particularly easily into a U-shaped receiving element, which keeps the electrical contact resistance particularly low.

The invention also relates to a method for fastening an electrical conductor on a printed circuit board. According to this method, the electrical conductor is clamped into the clamping element of the invention. This clamping is achieved by bending back the clamping web, and clamping the electrical conductor in between the clamping wings, whereupon the clamping element is pushed into a receiving element, and whereupon the securing claw is pressed or driven into the printed circuit board. Such a method can be fully automated, as a result of which it is particularly inexpensive and errors in the connection between the electrical conductor and the printed circuit board can be avoided almost completely.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be described with references to the following drawings.

DETAILED DESCRIPTION OF THE PRESENTLY PREFERRED EMBODIMENTS

Figure 1:
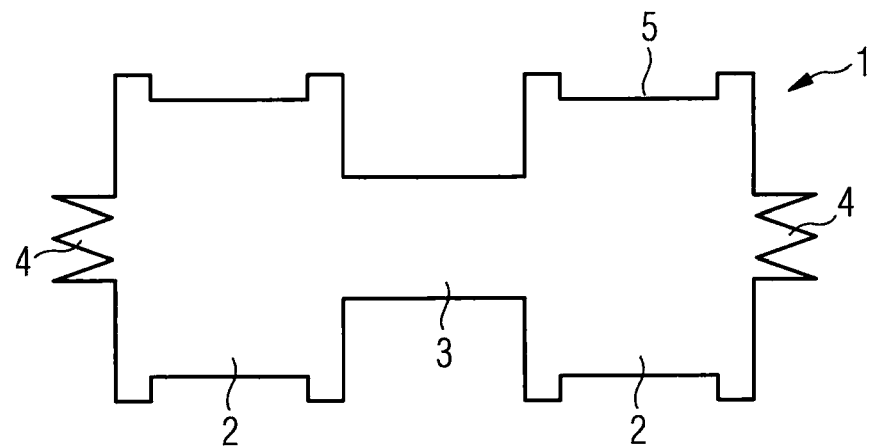
FIG. 1 shows a clamping element with two clamping wings.

FIG. 1 shows a clamping element 1 with two clamping wings 2. The two clamping wings 2 are connected to one another by means of the clamping web 3. Securing claws 4 can be seen on the clamping wings 2. Securing claws 4 are shown in the form of trifurcated securing claws 4, in this case, for example. Furthermore, in each case two conductor pockets 5 can be seen on the clamping wings 2. The clamping element 1 itself is in the form of a metallic stamped sheet-metal part, which can be produced extremely inexpensively and easily.

Figure 2:
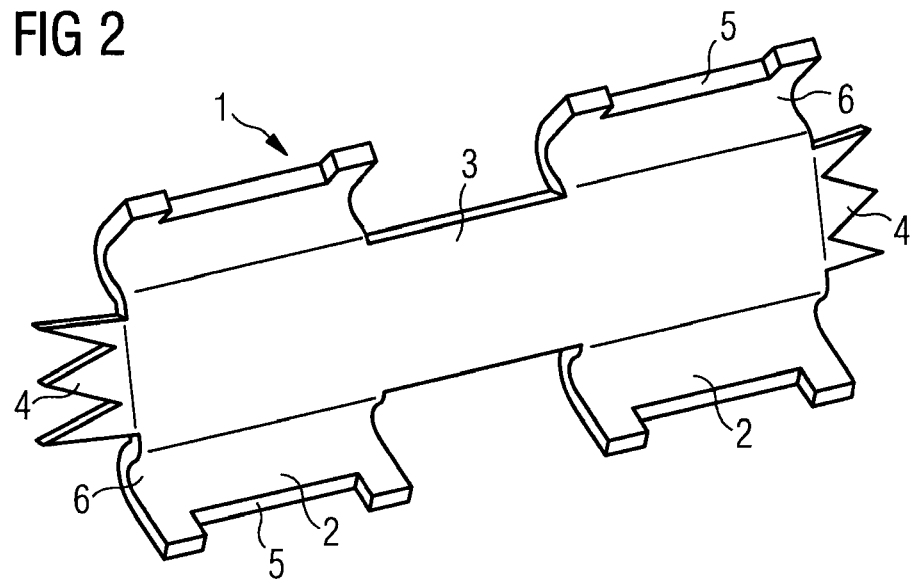
FIG. 2 shows a configuration of the clamping element illustrated in FIG. 1.

FIG. 2 shows a development of the clamping element illustrated in FIG. 1. Again, the clamping element 1 has two clamping wings 2, which are connected to one another by the clamping web 3. The clamping wings 2 are now equipped with clamping arches 6, which firstly ensure that an electrical conductor (not illustrated here) is mounted elastically and secondly delimit the contact face 8, which ensures that the clamping element 1 is mounted securely on the printed circuit board 9 illustrated in the following figures.

Figure 3:
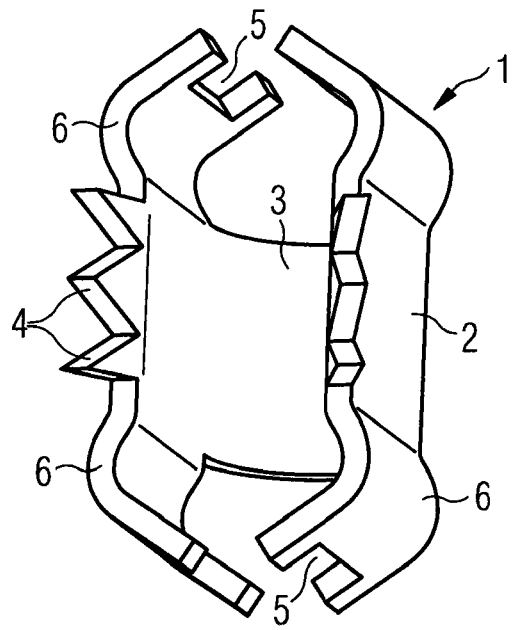
FIG. 3 shows the clamping element with a bent-back clamping web.

FIG. 3 shows the clamping element 1, with the clamping web 3 being bent back in such a way that the clamping wings 2 can advantageously clamp in the conductor 7 (not illustrated here). It can clearly be seen here that the conductor pockets 5 form cavities, into which the electrical conductor 7 can be inserted. The electrical conductor 7 may be, for example, a metallic wire or else a metallic stamped sheet-metal part, which is intended to be connected to the printed circuit board. Furthermore, it is also possible, for example, for an electrical conductor constructed from carbon fibers to be connected to the printed circuit board using the clamping element 1.

Figure 4:
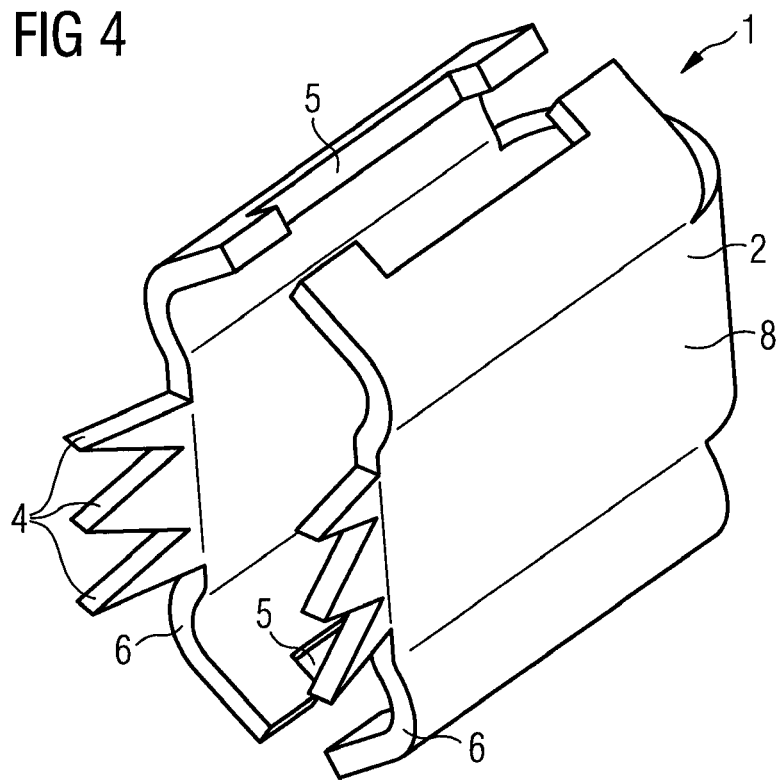
FIG. 4 shows the clamping element for fastening an electrical conductor from a further perspective.

FIG. 4 illustrates the clamping element 1 for fastening an electrical conductor 7 on a printed circuit board 9 from a different perspective. In this case too, the clamping wings 2 are shown, on which a securing claw 4 is formed in each case. The clamping wing arches 6 and the conductor pockets 5 are located in the clamping wings 2. Also shown is the contact face 8, which is delimited on the clamping wings 2 by the clamping wing arches 6.

Figure 5:
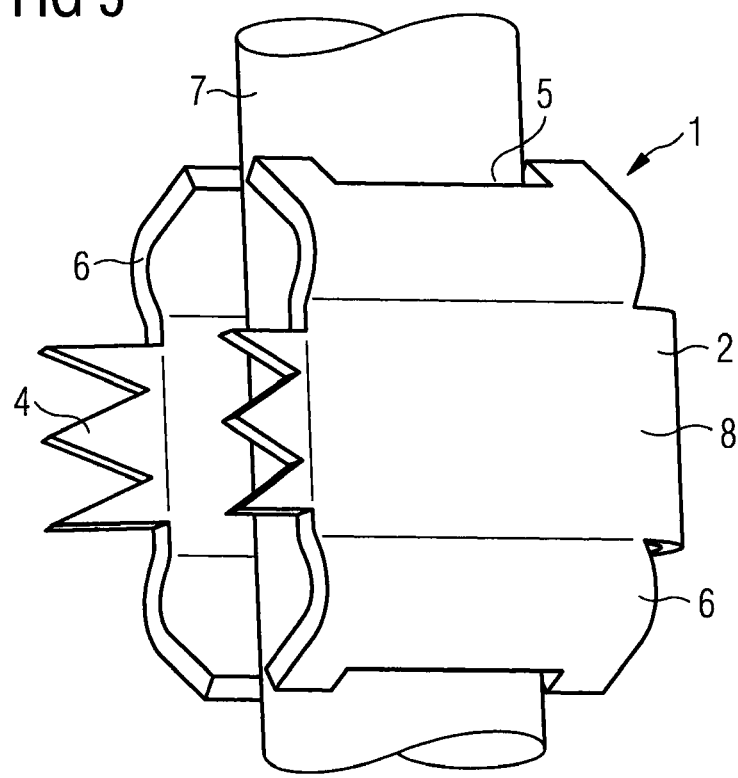
FIG. 5 shows the clamping element with an electrical conductor arranged therein.

FIG. 5 shows the clamping element 1 with an electrical conductor 7 arranged therein. The clamping element 1 in the form of a stamped sheet-metal part has two clamping wings 2, as in the preceding figures. The clamping wings 2 are connected to one another by a clamping web 3 arranged between the clamping wings 2. The clamping web 3 is bent back in such a way that the clamping wings 2 clamp in the conductor 7. In each case the securing claws 4 are shown on the clamping wings 2. Furthermore, the conductor pockets 5 are shown on the clamping wings 2, with the electrical conductor 7 being mounted securely in said conductor pockets. The conductor pockets 5 in this case surround the conductor 7. The clamping wings 2 furthermore have clamping wing arches 6, which make it possible for the conductor 7 to be mounted in a sprung manner. In this case, a certain pressure is exerted on the electrical conductor 7 such that the rims of the conductor pockets 5 become embedded in the surface of the electrical conductor 7 and fasten it securely on the clamping element 1. The clamping wing arches 6 delimit the contact face 8, which is part of the clamping wing 2.

Figure 6:
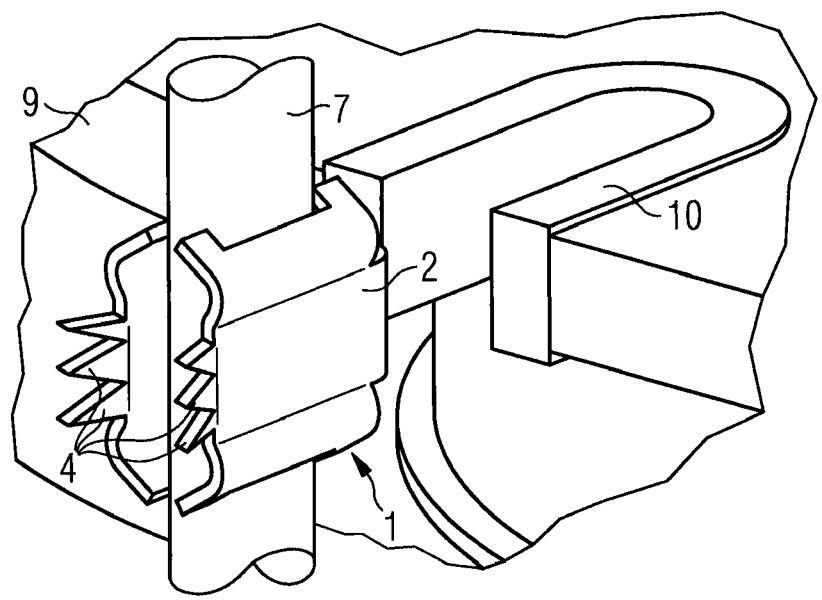
FIG. 6 shows a fastening system for an electrical conductor on a printed circuit board.

A fastening system for an electrical conductor 7 on a printed circuit board 9 with a clamping element 1 in accordance with the preceding FIGS. 1 to 5 is illustrated in FIG. 6. FIG. 6 shows the clamping element 1 with the two clamping wings 2, which are connected to one another by the clamping web 3, with securing claws 4 being formed on the clamping wings 2. The conductor pockets 5 on the clamping wings 2 ensure that the electrical conductor 7 is fastened securely in the clamping element 1. Furthermore, the clamping wing arches 6 ensure a constant contact-pressure of the rims of the conductor pockets 5 on the electrical conductor 7. FIG. 6 also shows the printed circuit board 9, with a receiving element 10 for the clamping element 1 being formed at the rim of said printed circuit board. In this example, the receiving element 10 is in the form of a U. However, it is also conceivable for the receiving element 10 to be rectangular, for example. At least the surface of the accommodating element 10 consists of an electrically conductive material, such as a metal. Once it has been bent back about the electrical conductor 7, the clamping element 1 is brought into a shape which can be inserted precisely into the receiving element 10 by means of a press fit. By virtue of the clamping wing arches 6, the contact face 8 of the clamping element 1 can be inserted very precisely into the receiving element 10. Once the clamping element 1 has been inserted into the receiving element 10, the securing claws 4 are pressed or driven into the printed circuit board 9. A permanent electrical and mechanical connection between the electrical conductor 7 and the receiving element 10 of the printed circuit board 9 is thus produced.

Figure 7:
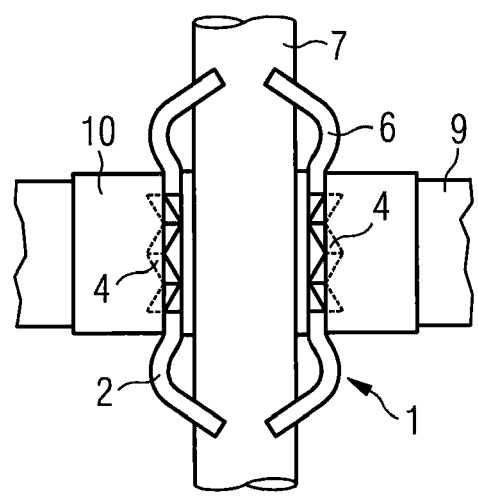
FIG. 7 shows a plan view of the clamping element inserted into the receiving element.

FIG. 7 shows a plan view of the clamping element 1 inserted into the receiving element 10. The electrical conductor 7 is clamped in in the clamping element 1, with it clearly being shown that the clamping wing arches 6 press the conductor pocket 5 against the electrical conductor 7. The securing claws 4 formed on the clamping wings 2 are driven laterally into the printed circuit board 9 in the region of the receiving element 10. A permanent mechanical and electrically conductive connection between the clamping element 1 and the receiving element 10 of the printed circuit board 9 is thus produced.

Figure 8:
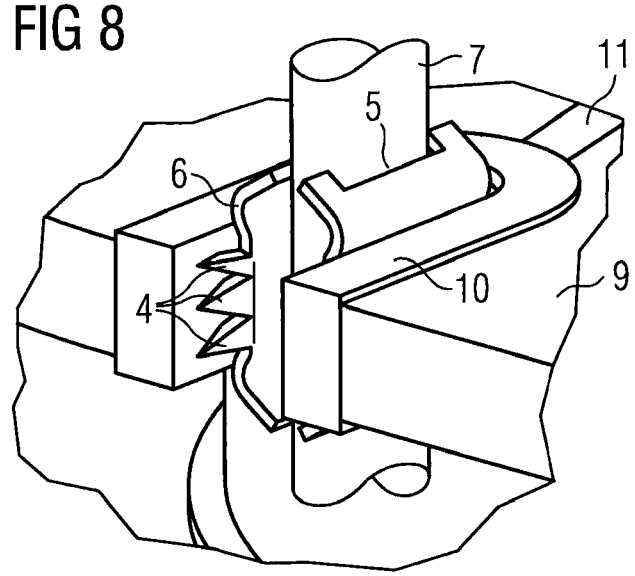
FIG. 8 shows a perspective view of the clamping element inserted into the receiving element.

FIG. 8 shows a perspective view of the clamping element 1 inserted into the receiving element 10. A conductor track 11 is shown on the receiving element 10. The conductor track 11 is formed on the printed circuit board 9 and conducts the electrical current from the electrical conductor 7 via the clamping element 1 and the receiving element 10 towards further electronic and electrical components, which can be arranged on the printed circuit board. FIG. 8 shows the electrical conductor 7, which is clamped in in mechanically secure fashion and which is held by the clamping element 1 and the conductor pockets 5 formed thereon. The conductor pockets 5 delimit the contact face 8 of the clamping element 1 in such a way that the clamping element 1 is mounted without play in the receiving element 10 of the printed circuit board 9. The mechanical fastening of the clamping element 1 is furthermore ensured by the securing claws 4, which are pressed into the printed circuit board 9 in the region of the receiving element 10.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

I claim:

1. A clamping element for fastening an electrical conductor to a printed circuit board, an electrically conductive connection being produced by the clamping element between the electrical conductor and the printed circuit board, the clamping element comprising:
   a stamped sheet-metal part including at least two clamping wings and one clamping web arranged between the clamping wings, the clamping web being bendable such that the clamping wings clamp in the conductor; and
   at least one securing claw protruding from an edge of at least one of the clamping wings such that the securing claw is pressable into the printed circuit board by bending back the clamping web.

2. The clamping element as claimed in claim 1, wherein the clamping wings have a conductor pocket configured to surround the conductor.

3. The clamping element as claimed in claim 1, wherein the clamping wings have a clamping wing arch configured to mount the conductor in a sprung manner.

4. The clamping element as claimed in claim 1, wherein the clamping wings have a contact face.

5. A fastening system for an electrical conductor on a printed circuit board, comprising:
   the clamping element as claimed in claim 1; and
   a receiving element with an electrically conductive surface formed on the printed circuit board, the clamping element being configured to be insertable into said receiving element.

6. The fastening system as claimed in claim 5, wherein the receiving element is U-shaped.

7. A method for fastening an electrical conductor on a printed circuit board, comprising:
   clamping the electrical conductor into a clamping element for fastening an electrical conductor to a printed circuit board, an electrically conductive connection being produced by the clamping element between the electrical conductor and the printed circuit board, the clamping element having: a stamped sheet-metal part including at least two clamping wings and one clamping web arranged between the clamping wings, wherein the clamping web is capable of being bent in such a way that the clamping wings clamp in the conductor; and at least one securing claw formed on the clamping wings, the securing claw being capable of being pressed into the printed circuit board, by bending back the clamping web; and
   clamping the electrical conductor in between the clamping wings of the clamping element, whereupon the clamping element is pushed into a receiving element, and whereupon the securing claw is one of pressed and driven into the printed circuit board.

\* \* \* \* \*